US008111081B2

(12) United States Patent
Saito

(10) Patent No.: US 8,111,081 B2
(45) Date of Patent: Feb. 7, 2012

(54) METHOD FOR EVALUATING SILICON WAFER

(75) Inventor: Hisayuki Saito, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 445 days.

(21) Appl. No.: 12/448,408

(22) PCT Filed: Dec. 14, 2007

(86) PCT No.: PCT/JP2007/001397
§ 371 (c)(1),
(2), (4) Date: Jun. 19, 2009

(87) PCT Pub. No.: WO2008/081567
PCT Pub. Date: Jul. 10, 2008

(65) Prior Publication Data
US 2010/0019796 A1  Jan. 28, 2010

(30) Foreign Application Priority Data
Jan. 5, 2007  (JP) .................................. 2007-000629

(51) Int. Cl.
*G01R 31/34* (2006.01)
(52) U.S. Cl. ............... 324/762.01; 324/719; 324/718; 324/713; 324/762.09; 324/519; 324/522; 324/754.07; 324/762.03; 324/756.05; 438/14; 438/15; 438/16; 438/17; 438/18; 29/825; 29/830; 29/835; 29/840; 29/887
(58) Field of Classification Search ............... 324/719, 324/718, 713, 762.09, 519, 522, 754.07, 324/762.03, 756.05; 438/14–18; 29/825–887
See application file for complete search history.

(56) References Cited

U.S. PATENT DOCUMENTS

| 5,179,433 A | * | 1/1993 | Misawa et al. ............. 257/48 |
| 5,739,052 A | * | 4/1998 | Krishnan et al. ............. 438/17 |
| 5,742,175 A | * | 4/1998 | Kato et al. ............. 324/762.05 |

(Continued)

FOREIGN PATENT DOCUMENTS

JP  A-8-330316  12/1996

(Continued)

OTHER PUBLICATIONS

Suehle, "Ultrathin Gate Oxide Releability: Physical Models, Statistics, and Characterization", IEEE Transactions on Electron Devices, vol. 49, No. 6, Jun. 2002.*

(Continued)

*Primary Examiner* — Jermele M Hollington
*Assistant Examiner* — Lamarr Brown
(74) *Attorney, Agent, or Firm* — Oliff & Berridge, PLC

(57) ABSTRACT

The present invention is a method for evaluating a silicon wafer by measuring, after fabricating a MOS capacitor by forming an insulator film and one or more electrodes sequentially on a silicon wafer, a dielectric breakdown characteristic of the insulator film by applying an electric field from the electrodes thus formed to the insulator film, the method in which the silicon wafer is evaluated at least by setting an area occupied by all the electrodes thus formed to 5% or more of an area of a front surface of the silicon wafer when the one or more electrodes are formed. This provides an evaluation method that can detect a defect by a simple method such as the TDDB method with the same high degree of precision as that of the DSOD method.

16 Claims, 3 Drawing Sheets

U.S. PATENT DOCUMENTS

| | | | |
|---|---|---|---|
| 5,744,380 A * | 4/1998 | Uemura et al. | 438/14 |
| 5,786,231 A * | 7/1998 | Warren et al. | 438/17 |
| 5,798,649 A * | 8/1998 | Smayling et al. | 324/551 |
| 5,834,322 A * | 11/1998 | Fusegawa et al. | 438/12 |
| 5,940,682 A * | 8/1999 | Tabara | 438/17 |
| 5,954,873 A | 9/1999 | Hourai et al. | |
| 6,014,034 A * | 1/2000 | Arora et al. | 324/762.01 |
| 6,198,301 B1 * | 3/2001 | Chetlur et al. | 324/762.09 |
| 6,246,075 B1 * | 6/2001 | Su et al. | 257/48 |
| 6,337,219 B1 * | 1/2002 | Nishikawa | 438/14 |
| 6,498,502 B2 * | 12/2002 | Edwards et al. | 324/754.21 |
| 6,528,335 B2 * | 3/2003 | Almonte et al. | 438/17 |
| 6,747,471 B1 * | 6/2004 | Chen et al. | 324/750.05 |
| 6,800,496 B1 * | 10/2004 | Chiang et al. | 438/17 |
| 6,815,971 B2 * | 11/2004 | Wang et al. | 324/762.03 |
| 6,864,702 B1 * | 3/2005 | Teggatz et al. | 324/762.09 |
| 7,193,469 B2 * | 3/2007 | Kaya | 330/277 |
| 7,619,435 B2 * | 11/2009 | Zhao et al. | 324/762.05 |
| 7,632,349 B2 * | 12/2009 | Itou et al. | 117/14 |
| 7,689,377 B2 * | 3/2010 | Jain et al. | 702/117 |
| 2004/0085084 A1 * | 5/2004 | Wang et al. | 324/765 |
| 2007/0109003 A1 * | 5/2007 | Shi et al. | 324/755 |
| 2008/0116455 A1 * | 5/2008 | Jain et al. | 257/48 |

FOREIGN PATENT DOCUMENTS

| | | |
|---|---|---|
| JP | A-9-64345 | 3/1997 |
| JP | A-2006-5088 | 1/2006 |

OTHER PUBLICATIONS

Slathis, "Physical and Predictive Models of Ultra Thin Oxide Reliability in CMOS Devices and Circuits", 39th Annual International Reliability Physics Symposium, Orlando, Florida, 2001, pp. 132-149.*

Wu et al., "Challenges for Accurate Reliability Projections in the Ultra-Thin Oxide Regime", 37th Annual International Reliability Physics Symposium, San Diego, Califiornia, 1999, pp. 57-65.*

Martin et al., Assessing MOS Gate Oxide Reliability on Wafer Level with Ramped/Constant Voltage and Current Stress, Integrated Reliability Workshop, 1995, pp. 81-91.*

Teramoto et al., "Area and Thickness Dependence of the TDDB Characteristics of Silicon Dioxides," *IEICE Technical Report*, vol. 94, No. 180, 1994, pp. 29-34.

Tamatsuka et al., "Medium Field Breakdown Origin on Metal Oxide Semiconductor Capacitor Containing Grown-in Czochralski Silicon Crystal Defects," *Jpn. J. Appl. Phys.*, vol. 37, Part 1, No. 3B, Mar. 1998, pp. 1236-1239.

* cited by examiner

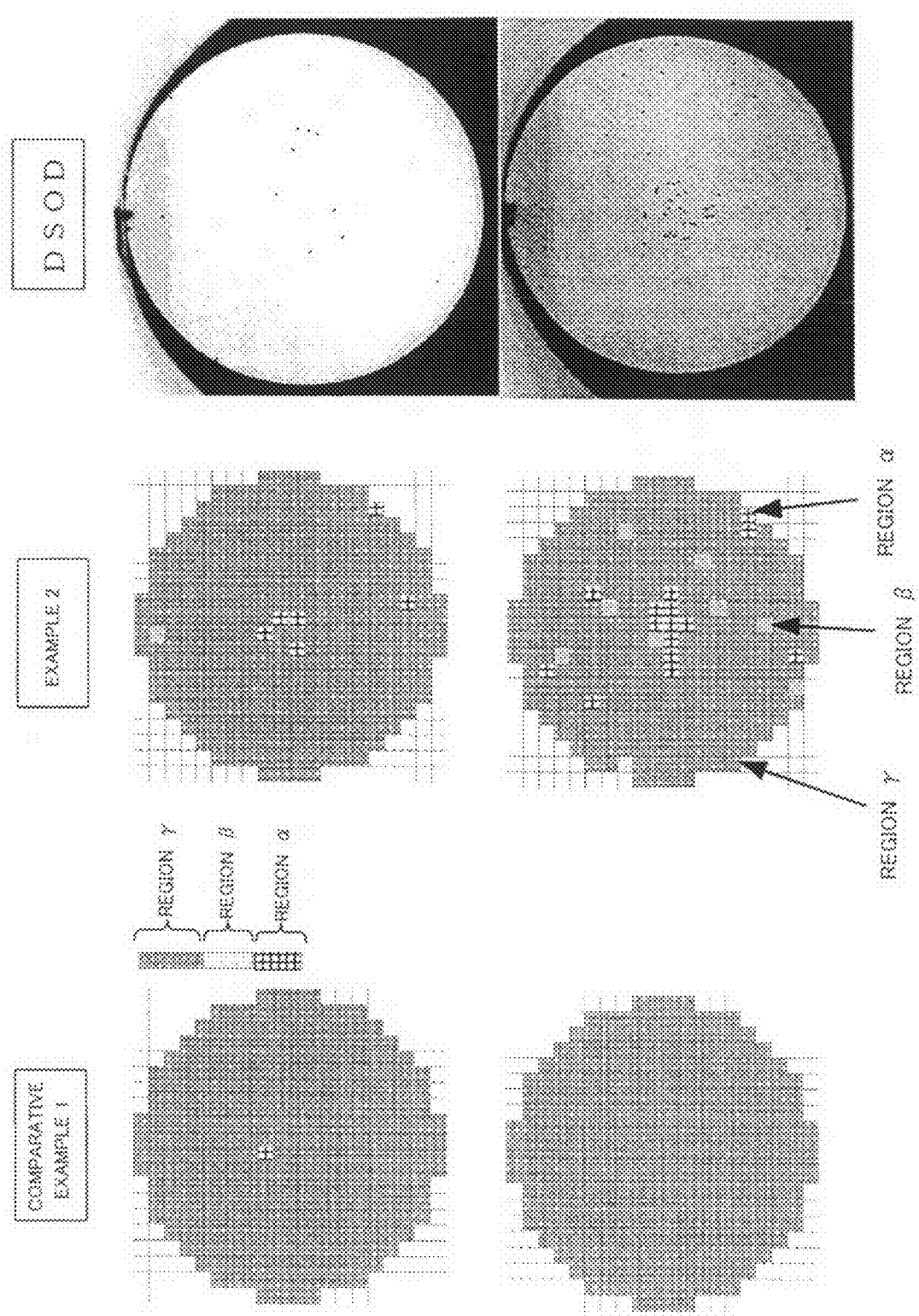

METHOD FOR EVALUATING SILICON WAFER

TECHNICAL FIELD

The present invention relates to methods for evaluating a silicon wafer, and, in particular, to a method for evaluating a silicon wafer by fabricating a MOS (metal oxide semiconductor) capacitor on a silicon wafer and measuring a dielectric breakdown characteristic of an oxide film (an insulator film) thereof.

BACKGROUND ART

GOI (gate oxide integrity) evaluation is very effective as a method for evaluating silicon and other semiconductor wafers (see, for example, M. Tamatsuka et al., "Medium Field Breakdown Origin on Metal Oxide Semiconductor Capacitor Containing Grown-in Czochralski Silicon Crystal Defects", Jpn. J. Appl. Phys., Vol. 37 (1998), pp. 1236-1239), and is commonly used widely. This method makes it possible to detect COPs (crystal originated particles) in the silicon wafer or the effects of metal contamination with an extremely high degree of sensitivity.

The GOI evaluation is performed as follows. The front surface of a silicon wafer, for example, is oxidized to form a silicon dioxide film (a gate oxide film) as an insulator film, an electrode such as a polysilicon film is formed thereon, whereby a MOS capacitor having a MOS structure is fabricated, then electrical stress is applied to the electrode to break down the gate oxide film, and the quality of the silicon wafer is evaluated based on the dielectric breakdown field intensity thus observed.

For example, when a defect such as a COP is present in the main surface of a silicon wafer, a silicon dioxide film is also formed on the inner wall of a void portion of the COP at the time of formation of an oxide film on the main surface of the silicon wafer. The oxide film formed on the inner wall of the COP has a reduced thickness at a corner (a corner part) of an octahedral structure. As a result, when an electrode is formed on the oxide film and an electric field is applied, electrical stress is concentrated in the part where the thickness of the oxide film is reduced, which is believed to cause a breakdown at a low electric field intensity. Therefore, by using such a phenomenon, it is possible to evaluate a silicon wafer by detecting a COP or the like present in the silicon wafer.

The above-described application of electrical stress can be performed by the TZDB (Time Zero Dielectric Breakdown) method or the TDDB (Time Dependent Dielectric Breakdown) method.

In the TZDB method, a value of current flowing through a MOS capacitor is monitored while changing the electric field intensity from 0 MV/cm to about 15 MV/cm in a stepwise fashion, and the electric field intensity when the gate oxide film of the MOS capacitor breaks down, that is, when a breakdown occurs, is measured. An insulator film having a dielectric breakdown field intensity equal to or greater than a predetermined value, for example, 8 MV/cm or greater, is judged to be good, and otherwise it is judged to be a failure, and, based on the ratio of the number of MOS capacitors judged to be good to the total number of MOS capacitors to which a voltage is applied, the quality of the insulator film is evaluated.

On the other hand, the TDDB method is a method by which constant electrical stress is continuously applied to an insulator film, and, based on the time before a dielectric breakdown occurs, the life of the insulator film is evaluated. For example, in the TDDB method in which a constant current is applied, a constant current is continuously applied to an insulator film, changes with time are obtained by detecting the electric field intensity at a predetermined time interval, and the time before a dielectric breakdown occurs is evaluated.

Moreover, in addition to the TDDB method and the TZDB method, there are other methods by which evaluations can be performed by measuring a defect in a silicon wafer. For example, there is a measuring method called DSOD (Direct Surface Oxide Defect).

The following is a description of this method. First, for example, a thin oxide film (25 nm to 50 nm) is grown on a silicon wafer to be evaluated, and electric charges are given thereto in alcohol in which Cu ions are dissolved. Then, an oxide film containing a defect breaks down, near that broken-down spot, $Cu^{2+}$ ions in alcohol combine with electrons and form metal Cu, and this metal Cu is precipitated. This makes it possible to identify the location of a weak oxide film.

This method makes it possible to detect a defect of microscopic size (size: 10 nm to 20 nm), and detect a defect with a high degree of precision even when the defect density of a silicon wafer to be evaluated is extremely low.

With these evaluation methods, previously, with the aim of improving a TDDB characteristic and a TZDB characteristic, various crystals such as a normal crystal, a slowly-cooled crystal, a quickly grown crystal, a defect-free crystal (an N-region crystal), and a nitrogen-doped crystal were formed.

In particular, an N region is a region outside an OSF region located midway between a V-rich region and an I-rich region, the region free from an FPD, an LSTD, and a COP which are caused by a vacancy and an LSEPD and an LFPD which are caused by a dislocation loop, and such an N-region crystal can be produced by adjusting a V/G value which is the ratio between a pulling rate V and a furnace temperature distribution G in the direction of a pulling shaft near the solid-liquid interface (JP-A-8-330316).

In each case, the crystals were evaluated by the conventional TDDB method or TZDB method, which can be performed with relative ease as described above. As a result, a crystal having an extremely low defect density, such as a defect-free crystal (an N-region crystal), could achieve a passing rate of 100% for the TDDB characteristic and the TZDB characteristic, which is the ultimate goal of GOI.

However, due to an extremely low production margin of an N-region crystal, even when production is performed under the conditions of production of an N-region crystal, the N-region crystal could not always be obtained. The problem is that, even when, for example, a relatively large-diameter N-region silicon wafer or the like having a diameter of 200 mm or more is set as a wafer to be evaluated and subjected to a conventional GOI evaluation, and the results reveal that a passing rate for the TDDB characteristic and the TZDB characteristic is 100%, when the same silicon wafer is evaluated by using a higher-precision defect measuring method such as the above-described DSOD method, a defect may be found. Therefore, a further improvement in precision is required.

DISCLOSURE OF INVENTION

The present invention has been made in view of the problem described above, and an object thereof is to provide a method for evaluating a silicon wafer, the method that can detect a defect by a simple method such as the TDDB method with the same high degree of precision as that of the DSOD method. In particular, an object thereof is to provide a method that can evaluate a silicon wafer accurately even when a silicon wafer having an extremely low defect density, such as an N-region silicon wafer.

In order to solve the problem described above, the present invention provides a method for evaluating a silicon wafer by measuring, after fabricating a MOS capacitor by forming an insulator film and one or more electrodes sequentially on a silicon wafer, a dielectric breakdown characteristic of the insulator film by applying an electric field from the electrodes thus formed to the insulator film, wherein the silicon wafer is evaluated at least by setting an area occupied by all the electrodes thus formed to 5% or more of the area of an front surface of the silicon wafer when the one or more electrodes are formed.

As described above, in the present invention, when a dielectric breakdown characteristic of an insulator film is measured, a MOS capacitor is first fabricated by forming an insulator film and one or more electrodes sequentially on a silicon wafer. When the one or more electrodes are formed, the area occupied by all the electrodes thus formed is set to 5% or more of the area of the front surface (the main surface) of the silicon wafer. In the conventional GOI evaluation method, the area occupied by all the formed electrodes is usually of the order of 1% or, at most, of the order of 2%. In the present invention, by contrast, since the total area occupied by the electrodes is 5% or more, it is possible to obtain much wider measurement range for measurement of the dielectric breakdown characteristic than before. This makes it possible to improve the precision with which to detect a defect remarkably, and detect a defect that cannot be detected by the conventional GOI evaluation method using a MOS capacitor. Furthermore, since the GOI evaluation can be performed in a manner similar to the conventional method except that the electrodes are formed in such a way as to make the total area of the electrodes larger, it can be performed with really ease and at low cost.

At this point, it is possible that the silicon wafer to be evaluated is an N-region silicon wafer.

As described above, in the present invention, it is possible to improve the precision with which to detect a defect and thereby evaluate a defect in a silicon wafer with a high degree of precision even when it is an N-region silicon wafer having an extremely low defect density.

Moreover, it is possible that the silicon wafer to be evaluated is a silicon wafer having a diameter of 200 mm or more.

Even a large silicon wafer having a diameter of 200 mm or more as described above, since the dielectric breakdown characteristic of the insulator film can be measured in a wide range due to the percentage of the area occupied by the electrodes being as large as 5% or more, making it possible to evaluate a defect in a silicon wafer with a high degree of precision.

Preferably, the TDDB characteristic is measured as the dielectric breakdown characteristic of the insulator film.

As described above, when the TDDB characteristic is measured as the dielectric breakdown characteristic of the insulator film, it is possible to simultaneously measure multiple points at one time, making it possible to perform evaluations with ease. Moreover, it is suitable for evaluating a crystal having a low defect density and a defect, which is small in size, and is particularly effective in setting a silicon wafer having a low defect density as an object to be evaluated.

Furthermore, it is possible that the electrode area of each of the one or more electrodes is set to 20 mm$^2$ to 40 mm$^2$.

As described above, by setting the area of each electrode to 20 mm$^2$ or more, it is possible to reduce the number of electrodes to be formed for making the total area of all the electrodes 5% or more, and prevent the evaluation time from becoming longer. Moreover, by setting it to 40 mm$^2$ or less, it is possible to apply a voltage to the end of a chip, making it possible to perform evaluations with high precision.

According to the present invention, it is possible to evaluate a defect in a silicon wafer, in particular, a silicon wafer having an extremely low defect density, such as an N-region silicon wafer, with ease and with a high degree of precision like the DSOD method.

BRIEF DESCRIPTION OF DRAWINGS

FIG. 4 is a measurement diagram of the measurement results of Comparative Example 1, Example 2, and the DSOD method.

BEST MODE FOR CARRYING OUT THE INVENTION

Figure 1:
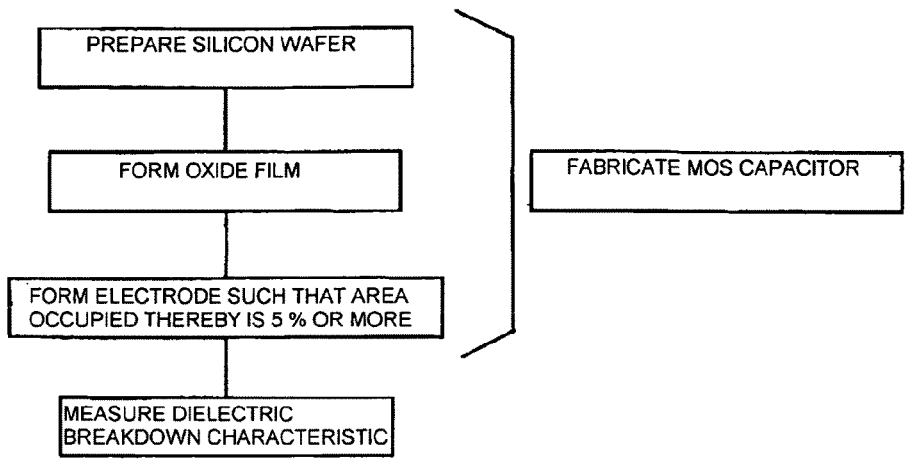
FIG. 1 is a flow diagram of an example of a process of a silicon wafer evaluation method of the present invention.

Hereinafter, an embodiment of the present invention is explained; the present invention, however, is not limited thereto.

As described above, a silicon wafer was previously evaluated by the GOI evaluation using the method such as the TDDB method or the TZDB method. However, even when a passing rate of 100% was achieved as a result of the evaluation performed by the TDDB method or the like, there was actually a defect in it, and it could be judged to be a failure by a higher-precision defect measuring method such as the DSOD method.

Moreover, detection of one or two GOI characteristic failures sometimes arises from an apparatus. It is often difficult to make a judgment whether a failure of a wafer, in particular, having a diameter of 200 mm or more and having an extremely low defect density, the wafer on which only a few void defects are generated, is really a failure of the wafer itself or a failure arising from an apparatus.

Therefore, the inventors of the present invention have intensively studied a method by which a defect in a silicon wafer can be detected with a high degree of precision even by a relatively simple GOI evaluation method such as the TDDB method.

First, an electrode formed on an insulator film by the conventional TDDB method or the like was studied, and it was found that, for example, when a silicon wafer to be evaluated had a diameter of 200 mm, by standard measurement, 100 electrodes each having an electrode area of 4 mm$^2$ were fabricated on the wafer, and, when it had a diameter of 300 mm, 300 electrodes each having an electrode area of 4 mm$^2$ were fabricated on the wafer. That is, with the conventional GOI evaluation, relative to the area of the front surface of a silicon wafer to be evaluated, the range of only about 1.3% ((100×4)/(100×100×3.14)) thereof when the diameter is 200 mm and the range of only about 1.7% ((300×4)/(150×150×3.14)) thereof when the diameter is 300 mm can be measured.

On the other hand, in the measurement by the DSOD method, the entire surface of the wafer is subjected to defect evaluation.

The inventors of the present invention attributed the difference in the number of defects detectable by the conventional GOI evaluation method and the DSOD method to the difference between the measurement ranges thereof.

Therefore, they believed that even a defect, which previously had been unable to be detected could be detected by extending the measurement range by significantly increasing the area occupied by all the formed electrodes (that is, the total area obtained by adding electrode areas of respective electrodes). More specifically, they found that, when the area occupied by all the formed electrodes described above was 5% or more of the area of the front surface of a silicon wafer to be evaluated, even with the GOI evaluation, a silicon wafer could be evaluated accurately by performing defect detection with the same high degree of precision as that of the DSOD method, and completed present invention.

Hereinafter, a silicon wafer evaluation method of the present invention is explained in detail with reference to the drawings; the present invention, however, is not limited thereto.

In FIG. 1, a flow diagram of an example of a silicon wafer evaluation method of the present invention is shown.

(Fabrication of a MOS Capacitor)

First, a method for fabricating a MOS capacitor that can be used in the evaluation method of the present invention is described.

First, a silicon wafer to be evaluated is prepared. Although the silicon wafer to be evaluated is not particularly limited, the present invention can be used more effectively by setting, as an object to be evaluated, a wafer having a low defect density such as an N-region silicon wafer, in particular. That is, it is particularly preferable to set, as an object to be evaluated, a wafer in which, no defect can be detected by the conventional GOI evaluation method even though it actually has a defect (by the DSOD method, the defect is detected as a failure). By the conventional method, it is difficult to differentiate wafers cut from low-defect, defect-free, and N-region single crystals; however, the present invention improves the precision and thereby makes it possible or extremely easy to differentiate them, making it possible to evaluate a silicon wafer in more detail.

Moreover, a diameter of a wafer is not particularly limited, and it can be set to a relatively large diameter of, for example, 200 mm or more, and even of 300 mm or more. Even a silicon wafer having such a large area can be measured with high precision by the present invention.

Then, the prepared silicon wafer is oxidized, whereby an oxide film (a gate oxide film) is formed as an insulator film. The formation of the oxide film can be easily performed by, for example, placing the silicon wafer mounted on a boat in a horizontal heat-treating furnace or a vertical heat-treating furnace, and heat-treating it in an atmosphere of oxygen. However, the method for forming it is not particularly limited, and it may be formed by CVD or the like.

Next, an electrode is formed on the oxide film formed on the silicon wafer. For that purpose, a polysilicon film (a polycrystalline silicon film), for example, is grown. This polysilicon film can be grown by placing the silicon wafer taken out from the heat-treating furnace in a CVD (Chemical Vapor Deposition) apparatus, and introducing a growth gas such as monosilane into a reaction container of the apparatus under reduced pressure or ordinary pressure. Then, after the polysilicon layer is deposited as described above, the polysilicon layer is doped with impurities such as phosphorus by using a thermal diffusion method or an ion implantation method, whereby a low resistivity polysilicon layer is formed. Incidentally, it is also possible to form a low resistivity polysilicon layer by depositing a polysilicon layer in such a way that it is doped with impurities at the same time.

Then, by performing an etching process after a series of photolithography processes including, for example, coat of a resist, exposure, and development is performed on the low resistivity polysilicon layer formed as described above, it is possible to form a polysilicon electrode in an intended position on the oxide film.

Incidentally, the electrode is not limited to a polysilicon electrode, and a material therefor, such as metal, can be determined on a case-by-case basis. In addition, it is preferable to form an electrode of low resistance such that measurement can be performed with high precision.

Then, in the present invention, in the above-described process of fabricating a MOS capacitor, the electrode is formed in such a way that the area occupied by the electrodes, the area that is the total area obtained by adding electrode areas of respective electrodes, is 5% or more of the area of the front surface of a silicon wafer. That is, by increasing the total area of the electrodes, the measurement area is increased.

Here, in order to demonstrate the effectiveness of increasing the total area of the electrodes as described above, the relationship between the defect density of a silicon wafer to be evaluated and the area occupied by all the electrodes in GOI measurement is described.

Figure 2:
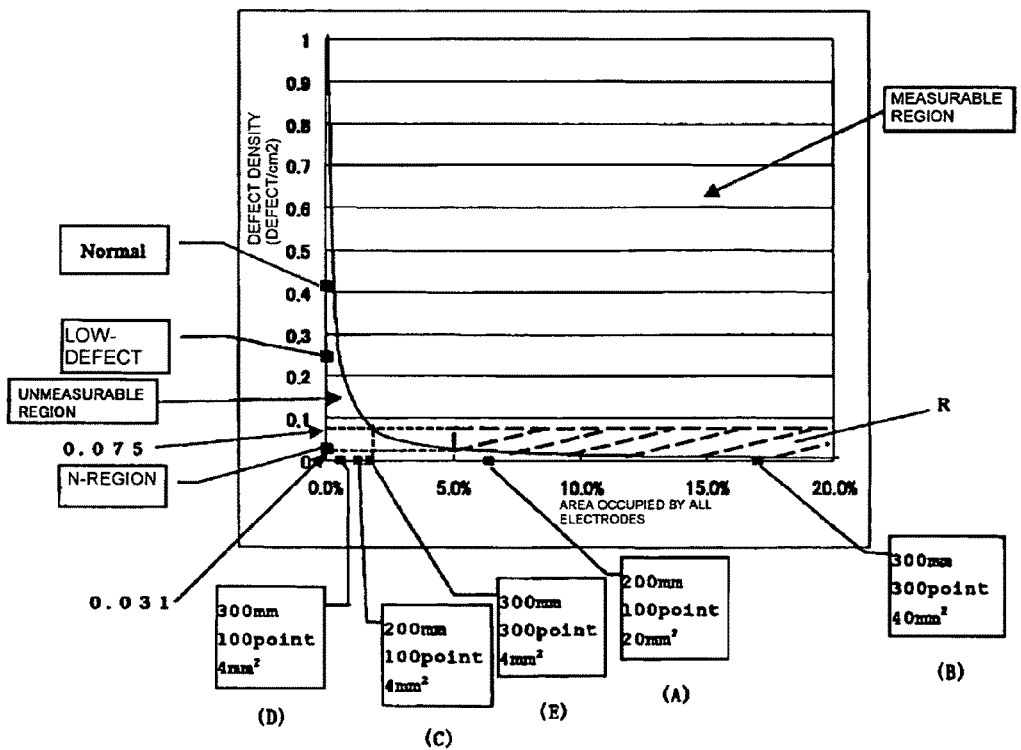
FIG. 2 is a graph for explaining the relationship between the defect density of a silicon wafer to be evaluated and the area occupied by all the electrodes in GOI measurement.

A graph shown in FIG. 2 was obtained by performing the GOI evaluation on silicon wafers cut from various crystals while varying the percentage of the area occupied by all the electrodes. An upper right portion of the graph represents a range in which a defect can be detected (a measurable region), and a lower left portion thereof represents a range in which it cannot be detected (an unmeasurable region).

Moreover, for reference purposes, the defect density (0.41 defect/cm$^2$) of a silicon wafer cut from an ordinary crystal (a normal crystal), the defect density (0.25 defect/cm$^2$) of a silicon wafer cut from a low-defect crystal, and the defect density (0.031 defect/cm$^2$) of a silicon wafer cut from an N-region crystal are shown in the graph.

The percentage of the area occupied by all the electrodes is explained by using typical examples.

(A) The diameter of a silicon wafer: 200 mm, the total number of electrodes: 100, the electrode area of each electrode: 20 mm$^2$, and the area occupied by all the electrodes: 6.3%.

(B) The diameter of a silicon wafer: 300 mm, the total number of electrodes: 300, the electrode area of each electrode: 40 mm$^2$, and the area occupied by all the electrodes: 17%.

(C) The diameter of a silicon wafer: 200 mm, the total number of electrodes: 100, the electrode area of each electrode: 4 mm$^2$, and the area occupied by all the electrodes: 1.3%.

(D) The diameter of a silicon wafer: 300 mm, the total number of electrodes: 100, the electrode area of each electrode: 4 mm$^2$, and the area occupied by all the electrodes: 0.57%.

(E) The diameter of a silicon wafer: 300 mm, the total number of electrodes: 300, the electrode area of each electrode: 4 mm$^2$, and the area occupied by all the electrodes: 1.7%.

As in the present invention, when the area occupied by all the electrodes is 5% or more of the area of the front surface of a silicon wafer to be evaluated ((A) and (B)), as is clear from FIG. 2, even when the defect density is 0.075 defect/cm$^2$, and further is 0.031 defect/cm$^2$ or lower, it is in the measurable region, and therefore it is possible to detect a defect even at such an extremely low defect density.

On the other hand, as in the conventional method, in this case, when the area occupied by all the electrodes is 1.7% or less of the area of the front surface of a silicon wafer to be evaluated ((C) to (E)), as is clear from FIG. 2, when the defect density becomes lower than 0.075 defect/cm², it enters the unmeasurable region, and therefore it is impossible to detect a defect even though a defect actually exists. As a result, as described above, even when a passing rate of 100% is achieved for a TDDB characteristic or the like by the conventional method, a defect is detected by a higher-precision defect measuring method such as the DSOD method.

However, as in FIG. 2, for example, even when the defect density is less than 0.075 defect/cm², the defect density at which a defect cannot be detected by the conventional method, according to the present invention, it is possible to detect the defect (a region R in FIG. 2). As described above, according to the present invention, it is possible to detect a defect in a silicon wafer with the same high degree of precision as that of the DSOD method, and make a judgment accurately whether it is really an N-region silicon wafer or not, for example.

Furthermore, since it is possible to measure a lower defect density, it is possible to evaluate the quality of a silicon wafer in more detail.

Now, when a MOS capacitor is formed in such a way that the area occupied by all the electrodes is 5% or more of the area of the front surface of a silicon wafer as described above, in order to achieve an actual increase in the area of the electrodes as a whole (increase the overall measurement area), there are two ways, of which one is "increasing the electrode area per electrode" and the other is "increasing the number of electrodes while leaving the electrode area per electrode unchanged".

(A Case where the Electrode Area Per Electrode is Increased)

First, a case where the electrode area per electrode is increased (that is, a case where the area per each measurement point is increased) is described. This is made possible by, for example, forming each electrode formed by a pattern that makes the area thereof larger than before in the above-mentioned photolithography process or etching process, such that the total area is 5% or more of the area of the front surface of the silicon wafer.

Incidentally, a specific electrode area of each electrode may be determined according to the area of the front surface of a silicon wafer, the resistance of an electrode, or the like, and is not particularly limited. Fabrication may be performed by making adjustments on a case-by-case basis and preparing an appropriate mask or the like used in the photolithography process such that the total area of all the electrodes is appropriately obtained.

For example, conventionally, in SEMI standards, most of setting values of the electrode area as GOI are usually 5 mm² or less. When a silicon wafer has a diameter of 200 mm, the area occupied by all the electrodes is 1.6%, provided that the number of electrodes is 100; in other cases, the area occupied by them is of the order, at most, of 2%.

However, according to the present invention, even when the number of electrodes to be formed is 100, which is the same as that of the conventional case, it is possible to make the total area of all the electrodes more than 5% (to be more precise, 6.3%) by setting the electrode area per electrode to 20 mm² or more, for example. As a result, it is possible to detect a defect, which could not be detected and would be overlooked by the conventional method, and make it possible to perform evaluations with a higher degree of precision.

Incidentally, as mentioned above, although the electrode area per electrode is not particularly limited, a too large electrode area can prevent a voltage from being applied to the end of a chip depending on the resistance of an electrode, and virtually reduce the effectiveness by increasing the area per electrode. Therefore, it is preferable to set an upper limit of about 40 mm², for example. Limiting the area to such an extent makes it possible to apply a voltage to the end of a chip reliably, and presents no problem in measurements. As described above, it is possible to determine the electrode area per each electrode with consideration given to the resistance of the electrode to be formed, or the like.

Moreover, when the measurement area is increased as described above, the probability that two or more defects are included in one chip is increased. Therefore, it is necessary to perform conversion. For example, when the electrode area per electrode is increased from conventional 4 mm² to 40 mm², the number of failures becomes about ten times in the case of a low density. With an increase in density, it becomes no longer simply ten times because it is occurred that two or more defects are incorporated in one chip.

Therefore, it is good to perform conversion by using the following equation indicating the relationship between a defect density and a measurement area.

$$\text{Defect density } (/\text{cm}^2) = \frac{1 - LN(\text{yield rate \%})/100}{\text{Electrode area } (\text{cm}^2)} \quad \text{[Equation 1]}$$

(A Case where the Number of Electrodes is Increased)

Next, a case where the number of electrodes is increased while leaving the electrode area per electrode unchanged (that is, the number of measurement points is increased while an area in the measurement point is unchanged) is described. This case is made possible by fabricating a larger number of electrodes than before by appropriately adjusting a mask pattern or the like in the photolithography process, such that the total area of the electrodes is 5% or more of the area of the front surface of a silicon wafer.

Conventionally, as mentioned above, for a silicon wafer having a diameter of 200 mm, for example, the GOI measurement is generally performed by forming 100 to 120 electrodes each having an electrode area of 5 mm² or less. In this case, the area occupied by all the electrodes is about 1.6%. For a silicon wafer having a diameter of 300 mm, 300 electrodes are generally formed. However, in this case, the area occupied by all the electrodes is still no more than about 1% to 2%, making it difficult to perform accurate evaluations of a silicon wafer containing a small number of defects, such as an N-region silicon wafer, in particular.

However, in the present invention, even when the electrode area of each electrode is 5 mm² or less as in the case of the conventional one, by forming, for example, 320 electrodes on a silicon wafer having a diameter of 200 mm and by forming about 710 electrodes on a silicon wafer having a diameter of 300 mm, it is possible to set the area occupied by all the electrodes to 5% or more of a silicon wafer to be evaluated. This makes it possible to perform evaluations with a higher degree of precision.

Furthermore, in this case, since the area of each chip is the same as the area with track records, there is no need to consider a difference in the electrode resistance due to a difference in the electrode area, the conversion of the numerical value of TDDB or TZDB, or the like, making it possible to perform evaluations with ease.

As described above, according to various conditions and the like, by increasing the electrode area of each electrode, increasing the number of electrodes while making the area of each electrode equal to the conventional one, or increasing the electrode area of each electrode and increasing the number of electrodes, a mask pattern or the like in the photolithography process is adjusted as needed, such that the area occupied by all the electrodes is 5% or more of the area of the front surface of a silicon wafer to be evaluated, whereby electrodes having an intended occupied area of 5% or more are formed.

(Measurement of a Dielectric Breakdown Characteristic)

In this way, after a MOS capacitor that can be used in the evaluation method of the present invention is fabricated, a dielectric breakdown characteristic measuring process in which a probe is brought into contact with the electrode and a constant current or voltage is applied to the oxide film from a variable power source is performed.

This measuring method is not particularly limited, and measurement can be performed as is conventionally done. Also, a measuring apparatus or the like to be used is not particularly limited.

Incidentally, as mentioned above, although there are the TZDB method and the TDDB method for the GOI evaluation, the TDDB method whose measurement conditions are stricter than those of the TZDB method is more preferable because it is possible to evaluate a crystal, such as an N-region silicon wafer, having an extremely low defect density and a defect which is small in size. Moreover, while the TZDB method measures individual electrodes separately, the TDDB method can simultaneously measure multiple points at one time. For example, in a case where measurement is performed by increasing the number of electrodes, there are 300 or more measurement points per wafer in some instances. Therefore, the TDDB method makes it easier to measure the whole wafer.

It is to be understood that the evaluation method of the present invention is not limited to the TDDB method; in the present invention, both the TDDB method and the TZDB method can be used as a measuring method. According to an object or measurement conditions, a measuring method can be determined on a case-by-case basis.

Hereinafter, the present invention is explained more specifically by using an example and a comparative example; the present invention, however, is not limited to these examples.

Examples 1 and 2 and Comparative Examples 1 to 3

First, as samples to be evaluated, silicon wafers having a diameter of 300 mm were prepared. Next, these silicon wafers were mounted on a boat and were placed in a thermal oxidation furnace, and then thermal oxidation was performed at 900° C., whereby an oxide film of 25.5 nm was formed on the main surface of the wafer. Then, the silicon wafers having the oxide film formed thereon were placed in a CVD apparatus, and a polysilicon layer was grown on the oxide film while being doped with phosphorus. At this point, the thickness of the polysilicon layer thus grown was 300 nm, and the resistance value was about 25 Ω/sq. as sheet resistance.

Then, after patterning was performed on this polysilicon layer by a photolithography process, the polysilicon layer was removed by wet etching with hydrofluoric-nitric acid in an etching process, whereby 300 MOS capacitors having the polysilicon layer as an electrode were formed in a plane of the wafer.

Thereafter, in order to remove the silicon dioxide film formed on the back surface of the silicon wafer, a resist was coated to the front surface of the silicon wafer, and wet etching was performed with diluted hydrofluoric acid.

Incidentally, the electrodes described above were formed such that the electrodes of different silicon wafers thus prepared had different electrode areas.

That is, the electrode area of each electrode was set as follows:

(Comparative Example 1) the electrode area of each electrode is 4 mm$^2$ (the area occupied by all the electrodes is 1.7%), (Comparative Example 2) the electrode area of each electrode is 8 mm$^2$ (the area occupied by all the electrodes is 3.4%), (Comparative Example 3) the electrode area of each electrode is 10 mm$^2$ (the area occupied by all the electrodes is 4.2%), (Example 1) the electrode area of each electrode is 20 mm$^2$ (the area occupied by all the electrodes is 8.5%), and (Example 2) the electrode area of each electrode is 40 mm$^2$ (the area occupied by all the electrodes is 17%).

Next, a dielectric breakdown characteristic of the oxide film was measured by bringing a probe into contact with the electrode of the MOS capacitor fabricated in this way, continuously applying a constant current to the oxide film, and monitoring changes with time in voltage applied to the oxide film. Current stress applied to the oxide film during this measurement process was 0.01 A/cm$^2$ (in terms of electric field intensity, about 12 MV/cm). Moreover, when current was applied, in order to reduce the measurement time, heating was performed such that the temperature of the oxide film reached 100° C.

Then, the silicon wafers were evaluated on a pass/fail basis based on whether or not an yield rate of γ mode (the quantity of electric charge at the time of dielectric breakdown is 5 C/cm$^2$ or more) of the TDDB characteristic thus obtained was 95%.

The results revealed that, as in Comparative Examples 1 to 3, when the electrode area of each electrode was 4 mm$^2$ to 10 mm$^2$ and the area occupied by all the electrodes was less than 5%, a passing rate of nearly 100% on average was obtained for the GOI characteristic, and the samples were judged to be N-region silicon wafers.

On the other hand, as in Examples 1 and 2, when the silicon wafers cut from the same crystal as that used for Comparative Examples 1 to 3 were evaluated on the condition that the electrode area of each electrode was 20 mm$^2$ or 40 mm$^2$ and the area occupied by all the electrodes was 5% or more, due to failure parts found in the center of the wafer, passing rates of only 92% and 89% on average were obtained in Example 1 and Example 2, respectively, for the GOI characteristic. That is, they were judged not to be N-region silicon wafers due to a relatively high defect density and a large number of failures.

Moreover, when a silicon wafer cut from the same crystal used in Examples 1 and 2 and Comparative Examples 1 to 3 was evaluated by the DSOD method, a crystal defect was detected in the center of the crystal.

Incidentally, the DSOD method was conducted under the following conditions.

Oxidation condition: Pyro oxidation at 900° C. and the thickness of the oxide film was 50 nm.

Measurement condition: a wafer with an oxide film was immersed in methanol in which Cu ions were dissolved, and voltage was applied for ten minutes with an electric field intensity of 5 MV/cm by using the wafer as a cathode and the Cu electrode as an anode.

Figure 3:
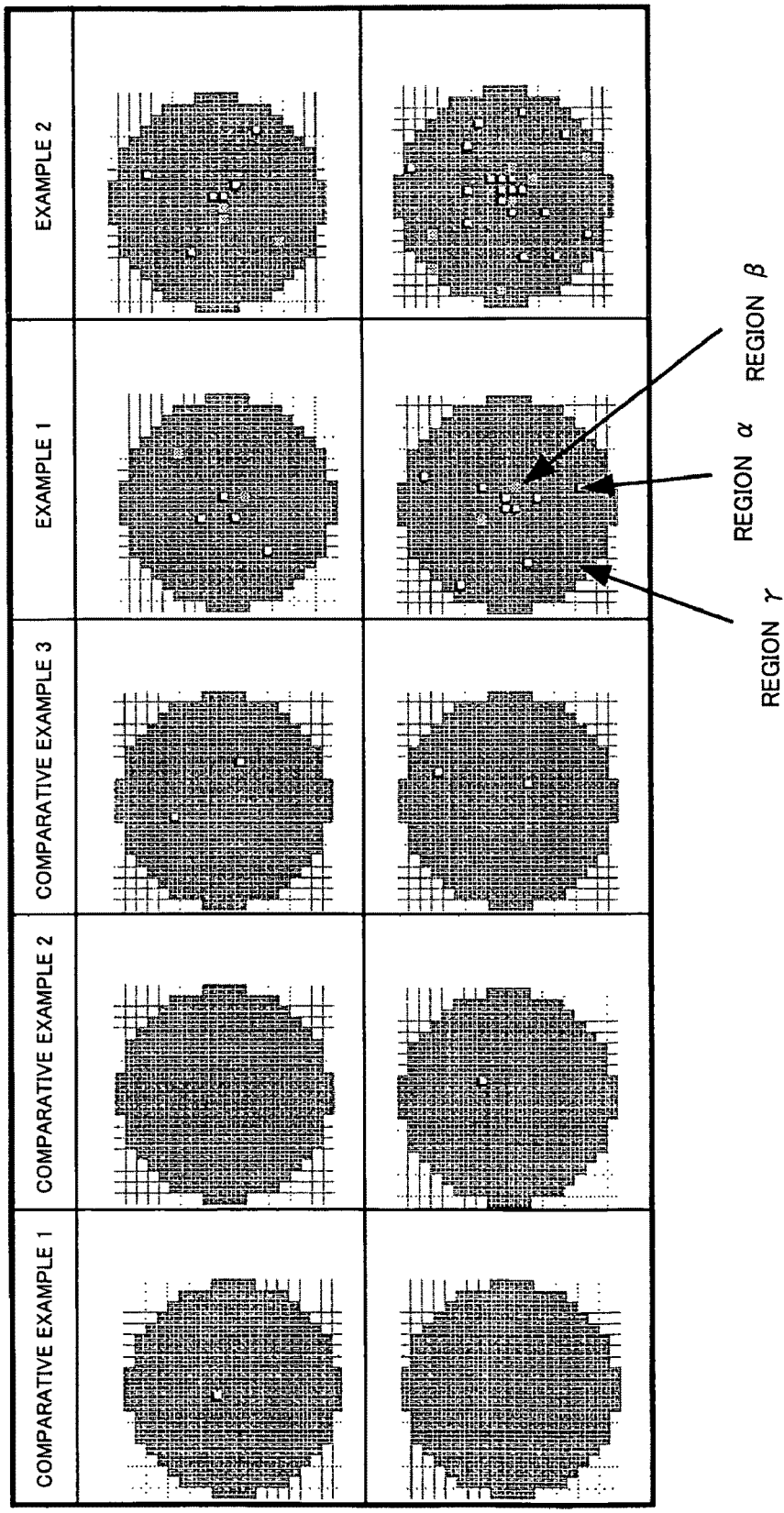
FIG. 3 is a measurement diagram of the measurement results of Comparative Examples 1 to 3 and Examples 1 and 2.

In FIG. 3, examples of the distribution of defects in the samples of Examples 1 and 2 and Comparative Examples 1 to 3 are shown. Incidentally, in FIG. 3 (and FIG. 4, which will be described later), a region α is a failure spot, in which a breakdown of the oxide film occurs at 0.01 C/cm$^2$ or less, a region β is also judged to be a failure spot, in which a breakdown of the oxide film occurs in a region from 0.01 C/cm² to less than 5.0 C/cm², and a region γ is a region in which a breakdown of the oxide film occurs at 5.0 C/cm² or more, and is judged to be a good item.

As described above, in Comparative Examples 1 to 3, most of the defects cannot be detected. In the conventional evaluation method, as mentioned above, they are judged to be N-region silicon wafers. Furthermore, in actuality, when the number of detected failures is one or two, in particular, it is difficult to make a judgment whether the silicon wafer contains defects or the detection results are due to a measuring apparatus.

By contrast, in Examples 1 and 2, mainly near the center of the sample, more defects are detected than in Comparative Examples 1 to 3. This reveals that they are not the detection results due to an apparatus, a certain number of defects are actually present in the silicon wafer, and the defect density thereof is not low enough to be judged to be an N-region silicon wafer. Furthermore, in Examples 1 and 2, more defects can be detected in Example 2 in which the electrode area is further increased, than in Example 1. That is, by increasing the electrode area (measurement area), it is possible to obtain the results of higher precision.

Moreover, FIG. 4 is examples of the distribution of defects in the samples of Comparative Example 1, Example 2, and the DSOD method described above.

As is the case with the detection results obtained by the DSOD method with high precision (in the upper and lower observation images in FIG. 4, defects are observed in the plane of the wafer; in particular, defects are noticeably observed in the center of the lower observation image), Example 2 in which the present invention was carried out can detect defects with high precision. On the other hand, in Comparative Example 1 in which the conventional TDDB method was carried out, most of the defects cannot be detected.

As described above, by the silicon wafer evaluation method of the present invention, it is possible to detect a defect by a relatively simple measuring method such as the TDDB method by using a MOS capacitor with the same high degree of precision as that of the DSOD method, and evaluate a sample more accurately. In particular, the present invention is particularly effective in evaluating a silicon wafer whose defect density is extremely low to the extent unable to be detected by the conventional GOI method.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for evaluating a silicon wafer by measuring, after fabricating a MOS (Metal Oxide Semiconductor) capacitor by forming an insulator film and one or more electrodes sequentially on a silicon wafer, a dielectric breakdown characteristic of the insulator film by applying an electric field from the electrodes thus formed to the insulator film, wherein
the silicon wafer is evaluated at least by setting an area occupied by all the electrodes thus formed to 5% or more of an area of a front surface of the silicon wafer when the one or more electrodes are formed.

2. The method for evaluating a silicon wafer according to claim 1, wherein
the silicon wafer to be evaluated is an N-region silicon wafer.

3. The method for evaluating a silicon wafer according to claim 1, wherein
the silicon wafer to be evaluated is a silicon wafer having a diameter of 200 mm or more.

4. The method for evaluating a silicon wafer according to claim 1, wherein
the silicon wafer is evaluated by measuring a TDDB (Time Dependent Dielectric Breakdown) characteristic as the dielectric breakdown characteristic of the insulator film.

5. The method for evaluating a silicon wafer according to claim 1, wherein
an electrode area of each of the one or more electrodes is set to 20 mm² to 40 mm².

6. The method for evaluating a silicon wafer according to claim 2, wherein
the silicon wafer to be evaluated is a silicon wafer having a diameter of 200 mm or more.

7. The method for evaluating a silicon wafer according to claim 2, wherein
the silicon wafer is evaluated by measuring a TDDB characteristic as the dielectric breakdown characteristic of the insulator film.

8. The method for evaluating a silicon wafer according to claim 3, wherein
the silicon wafer is evaluated by measuring a TDDB characteristic as the dielectric breakdown characteristic of the insulator film.

9. The method for evaluating a silicon wafer according to claim 6, wherein
the silicon wafer is evaluated by measuring a TDDB characteristic as the dielectric breakdown characteristic of the insulator film.

10. The method for evaluating a silicon wafer according to claim 2, wherein
an electrode area of each of the one or more electrodes is set to 20 mm² to 40 mm².

11. The method for evaluating a silicon wafer according to claim 3, wherein
an electrode area of each of the one or more electrodes is set to 20 mm² to 40 mm².

12. The method for evaluating a silicon wafer according to claim 4, wherein
an electrode area of each of the one or more electrodes is set to 20 mm² to 40 mm².

13. The method for evaluating a silicon wafer according to claim 6, wherein
an electrode area of each of the one or more electrodes is set to 20 mm² to 40 mm².

14. The method for evaluating a silicon wafer according to claim 7, wherein
an electrode area of each of the one or more electrodes is set to 20 mm² to 40 mm².

15. The method for evaluating a silicon wafer according to claim 8, wherein
an electrode area of each of the one or more electrodes is set to 20 mm² to 40 mm².

16. The method for evaluating a silicon wafer according to claim 9, wherein
an electrode area of each of the one or more electrodes is set to 20 mm² to 40 mm².

* * * * *